(12) United States Patent
Chang et al.

(10) Patent No.: US 9,696,013 B2
(45) Date of Patent: Jul. 4, 2017

(54) ILLUMINATION SYSTEM MULTI-LAYERED WAVELENGTH-CONVERTING DEVICE

(71) Applicant: DELTA ELECTRONICS, INC., Taoyuan (TW)

(72) Inventors: Keh-Su Chang, Taoyuan (TW); Jau-Shiu Chen, Taoyuan (TW); Yen-I Chou, Taoyuan (TW); Chi Chen, Taoyuan (TW)

(73) Assignee: DELTA ELECTRONICS, INC., Taoyuan ( * ) Notice: Subject to any disclaimer, the term of this patent is extended or adjusted under 35 U.S.C. 154(b) by 112 days.

(21) Appl. No.: 14/755,378

(22) Filed: Jun. 30, 2015

(65) Prior Publication Data

US 2016/0069538 A1 Mar. 10, 2016

Related U.S. Application Data

(60) Provisional application No. 62/046,505, filed on Sep. 5, 2014.

(30) Foreign Application Priority Data

Jan. 16, 2015 (TW) .............................. 104101526 A

(51) Int. Cl.
*F21V 3/04* (2006.01)
*F21V 13/08* (2006.01)
(Continued)

(52) U.S. Cl.
CPC .............. *F21V 13/08* (2013.01); *F21V 14/08* (2013.01); *G02B 26/008* (2013.01); *H01L 33/50* (2013.01)

(58) Field of Classification Search
CPC .... F21V 3/0463; F21V 13/08; F21V 2200/30; G02B 6/0003; G02B 6/0035; G02B 6/0043
See application file for complete search history.

(56) References Cited

U.S. PATENT DOCUMENTS

2012/0138874 A1 6/2012 Yuan et al.

FOREIGN PATENT DOCUMENTS

EP 2068193 A2 6/2009
EP 2362452 A2 8/2011
(Continued)

*Primary Examiner* — Ismael Negron
(74) *Attorney, Agent, or Firm* — Kirton McConkie; Evan R. Witt

(57) ABSTRACT

An illumination device includes a solid-state light-emitting element, and a wavelength-converting device with a transmissive substrate, a phosphor layer and a reflective optical layer. The transmissive substrate has a refraction coefficient $n_s$ greater than an ambient refraction coefficient $n_{amb}$. The phosphor layer is disposed over a side of the transmissive substrate and the reflective optical layer is disposed over a side of the transmissive substrate opposite to the phosphor layer. The reflective optical layer has an effective refraction coefficient $n_r$. The relation between $n_s$, $n_{amb}$ and $n_r$ is given by $n_r > 2(n_{amb}^2)/n_s$.

11 Claims, 8 Drawing Sheets

(51) Int. Cl.
    *G02B 26/00*     (2006.01)
    *F21V 14/08*     (2006.01)
    *H01L 33/50*     (2010.01)

(56) References Cited

FOREIGN PATENT DOCUMENTS

| | | |
|---|---|---|
| JP | 2009140822 A | 6/2009 |
| JP | 2010534386 A | 11/2010 |
| JP | 2011109094 A | 6/2011 |
| JP | 2011171740 A | 9/2011 |
| JP | 2014505744 A | 3/2014 |
| TW | 448705 B | 8/2001 |
| TW | 201300506 A | 1/2013 |
| TW | 201349598 A | 12/2013 |
| WO | 2012026206 A1 | 3/2012 |

ILLUMINATION SYSTEM MULTI-LAYERED
WAVELENGTH-CONVERTING DEVICE

CROSS-REFERENCE TO RELATED
APPLICATION

This application claims the benefit of U.S. Provisional Application No. 62/046,505 filed on Sep. 5, 2014, and entitled "A HIGH REFLECTIVE SUBSTRATE STRUCTURE AND ITS USE ON PHOSPHOR WHEEL", the entirety of which is hereby incorporated by reference.

FIELD OF THE INVENTION

The present invention relates to a wavelength-converting device, and more particularly to a wavelength-converting device and an illumination system using the same.

BACKGROUND OF THE INVENTION

A wavelength-converting device is an optical transducing device, which is mainly utilized for converting a wavelength of light into a wavelength of visible light as a light source. Usually, it is applied to special lightings, such as spotlights, headlights, monitor lightings or projector lightings.

In general, most of conventional wavelength-converting devices are phosphor wheels. A kind of phosphor wheel is used for transforming laser light into color light with different wavelengths. Under the high-power operation, if a phosphor wheel has high optical converting efficiency, the photoelectric conversion can significantly enhance the luminance output of a projector. Accordingly, the phosphor wheel becomes an important light source of new generation projection technology in recent years.

Please refer to FIG. 1. FIG. 1 schematically illustrates the cross-sectional view of a conventional phosphor wheel of prior art. The conventional phosphor wheel 1 is a three-layer structure. The conventional phosphor wheel 1 has a substrate 10, a reflection layer 11 and a phosphor layer 12. The reflection layer 11 is formed on the substrate 10, and the phosphor layer 12 is formed on the reflection layer 11. That is, the reflection layer 11 is formed between the substrate 10 and the phosphor layer 12. After the first waveband light L1 is to excite the phosphor powder 121 in the phosphor layer 12 and transformed into second waveband light L2, the second waveband light L2 is omnidirectional emitted and scattered. As the emitting or scattering direction away from the reflection layer 11 in the phosphor layer 12 is defined as a backward direction, the emitting or scattering direction toward the reflection layer 11 in the phosphor layer 12 is called forward direction. The emitting or scattering light in the forward direction will be reflected by the reflection layer 11 and outputted in the backward direction. Because the second waveband light L2 transformed by the phosphor powder belongs to Lambertian reflectance model, the reflection layer 11 has to have the ability to reflect an incident light with an incidence angle greater than 70 degrees besides reflecting visible light with wavelength between 400-700 nanometers. It is a hard work and a difficult task to cope with the broad reflection band and the large incidence angle for the multilayer reflection mirror technology.

In addition, considering the Brewster angle ($\theta_B = \tan^{-1}(n_2/n_1)$) effect of the incident environment $n_1$ and the transmissive environment $n_2$, when the incidence angle of an incident light is greater than or equal to the Brewster angle, the P-polarized light of the incident light will be fully transmitted through the reflection layer 11, such that the reflection rate of the reflection layer 11 is significantly decreased, which causing the light leakage phenomenon. For example, when incident light is transmitted into the air with refraction coefficient n=1 from a substance with an effective refraction coefficient n=1.4-1.5, the Brewster angle is 35.5 degrees, and a critical angle ($\theta_C = \sin^{-1}(n_2/n_1)$) is 45.6 degrees. That is, when the incidence angle of the incident light is greater than or equal to 35.5 degrees and less than 45.6 degrees, the P-polarized light of the incident light will be fully transmitted through the reflection layer 11, and the light leakage phenomenon occurs. When the incidence angle of the incident light is greater than or equal to 45.6 degrees, the incident light will be fully reflected by the critical angle. It can be extrapolated that in the structure of the conventional phosphor wheel 1, since the reflection layer 11 is formed between the phosphor layer 12 ($n_1 \sim 1.4-1.5$) and the substrate 10 ($n_s$) and the Brewster angle is less than the critical angle, when the incidence angle of the incident light is greater than or equal to the Brewster angle and less than the critical angle, there will be a lot of loss of the incident light, which cannot be reflected and applied to the optical path. A large amount of energy is wasted, and the difficulty of fabrication of the wavelength-converting device and the illumination system is significantly increased.

There is a need of providing a wavelength-converting device and an illumination system using the same to obviate the drawbacks encountered from the prior art.

SUMMARY OF THE INVENTION

Some embodiments of the present invention is to provide a wavelength-converting device and an illumination system using the same in order to overcome at least one of the above-mentioned drawbacks encountered by the prior arts.

The present invention provides a wavelength-converting device and an illumination system using the same. By selecting materials and structures for satisfying the equations of $\theta_C = \sin^{-1}(n_{amb}/n_s)$ and $n_r > 2(n_{amb}^2)/n_s$, the Brewster angle $\theta_B$ can be greater than the critical angle $\theta_C$, and total reflection is also used to eliminate the difficulties of designing multilayer reflection mirrors capable of reflecting broad coverage of incidence angles. The light leakage is avoided, fabrication of the wavelength-converting device and the illumination system is simplified, and the difficulty of material selection is reduced.

In accordance with an aspect of the present invention, a wavelength-converting device used for converting first waveband light includes a transmissive substrate, a phosphor layer and an optical layer. The transmissive substrate has a refraction coefficient $n_s$, the refraction coefficient $n_s$, is greater than an environmental refraction coefficient $n_{amb}$. The phosphor layer is disposed over a side of the transmissive substrate for converting the first waveband light into second waveband light. The optical layer is disposed over the other side of the transmissive substrate opposite to the phosphor layer for reflecting the second waveband light. The optical layer has an effective refraction coefficient $n_r$. The relation between $n_s$, $n_{amb}$ and $n_r$ is given by $n_r > 2(n_{amb}^2)/n_s$.

In accordance with another aspect of the present invention, an illumination system includes a solid-state light-emitting element and a wavelength-converting device. The solid-state light-emitting element is configured for emitting a first waveband light to an optical path. The wavelength-converting device is disposed on the optical path. The wavelength-converting device includes a transmissive substrate, a phosphor layer and an optical layer. The transmissive substrate has a refraction coefficient $n_s$, the refraction coefficient $n_s$ is greater than an environmental refraction coefficient $n_{amb}$. The phosphor layer is disposed over a side of the transmissive substrate for converting the first waveband light into second waveband light and outputting the second waveband light. The optical layer is disposed over the other side of the transmissive substrate opposite to the phosphor layer for reflecting the second waveband light. The optical layer has an effective refraction coefficient $n_r$. The relation between $n_s$, $n_{amb}$ and $n_r$ is given by $n_r > 2(n_{amb}^2)/n_s$ The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
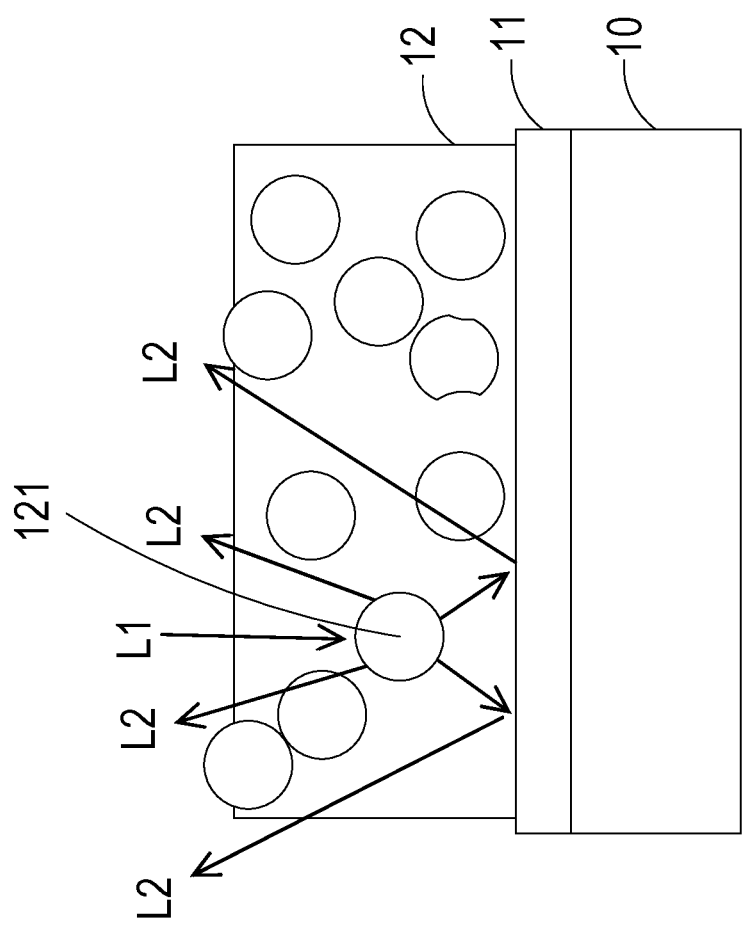
FIG. 1 schematically illustrates the cross-sectional view of a conventional phosphor wheel of prior art.
Figure 2:
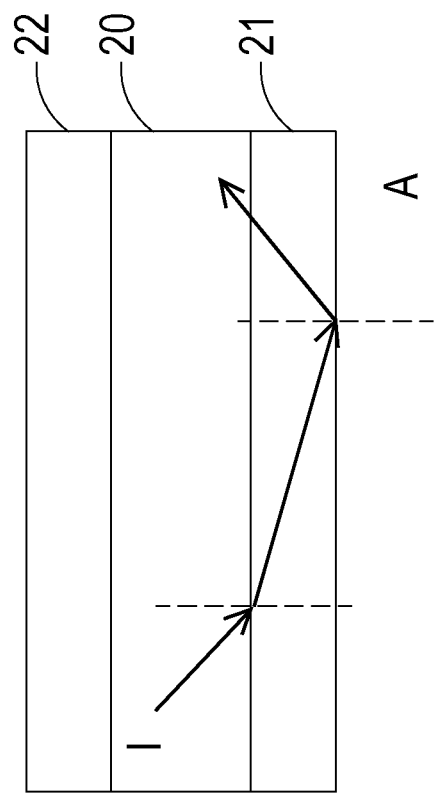
FIG. 2 schematically illustrates an incident light transmitted from a substrate to an optical layer of a wavelength-converting device and reflected by the interface of the optical layer and the environmental media according to an embodiment of the present invention.

Please refer to FIG. 2. FIG. 2 schematically illustrates incident light transmitted through a substrate to an optical layer of a wavelength-converting device and reflected by the interface of the optical layer and an environmental media according to an embodiment of the present invention. As shown in FIG. 2, a wavelength-converting device 2 of the present invention provides an optical layer 21 plated under a substrate 20, such that the substrate 20 is disposed between a phosphor layer 22 and the optical layer 21. Under this optical configuration, incident light is transmitted into the optical layer 21 from the substrate 20. In particular, incident light I is transmitted into the optical layer 21 from the transmissive substrate 20, and then is reflected by an interface of the optical layer 21 and the environmental media A. The critical angle $\theta_C$ is given by $\theta_C = \sin^{-1}(n_{amb}/n_s)$, among which $n_{amb}$ is the environmental refraction coefficient, and $n_s$ is the refraction coefficient of the transmissive substrate 20. The Brewster angle $\theta_B$ is given by $\theta_B = \tan^{-1}(n_r/n_s)$, among which $n_r$ is the effective refraction coefficient of the optical layer 21. By the critical angle created by the transmissive substrate 20 and the environmental media A, only the incident light covering from 400 to 700 nm wavelength with incidence angle less than critical angle is required to be considered, and thus the Brewster angle $\theta_B$ greater than the critical angle $\theta_C$ is easier to attain. After calculation, the relation between $n_s$, $n_{amb}$ and $n_r$ is given by $n_r > 2(n_{amb}^2)/n_s$. In other words, if the equations of $\theta_C = \sin^{-1}(n_{amb}/n_s)$ and $n_r > 2(n_{amb}^2)/n_s$ are satisfied by the materials and structures utilized by the wavelength-converting device of the present invention, the Brewster angle $\theta_B$ is greater than the critical angle $\theta_C$, so that the loss of the incident light is reduced.

Figure 3:
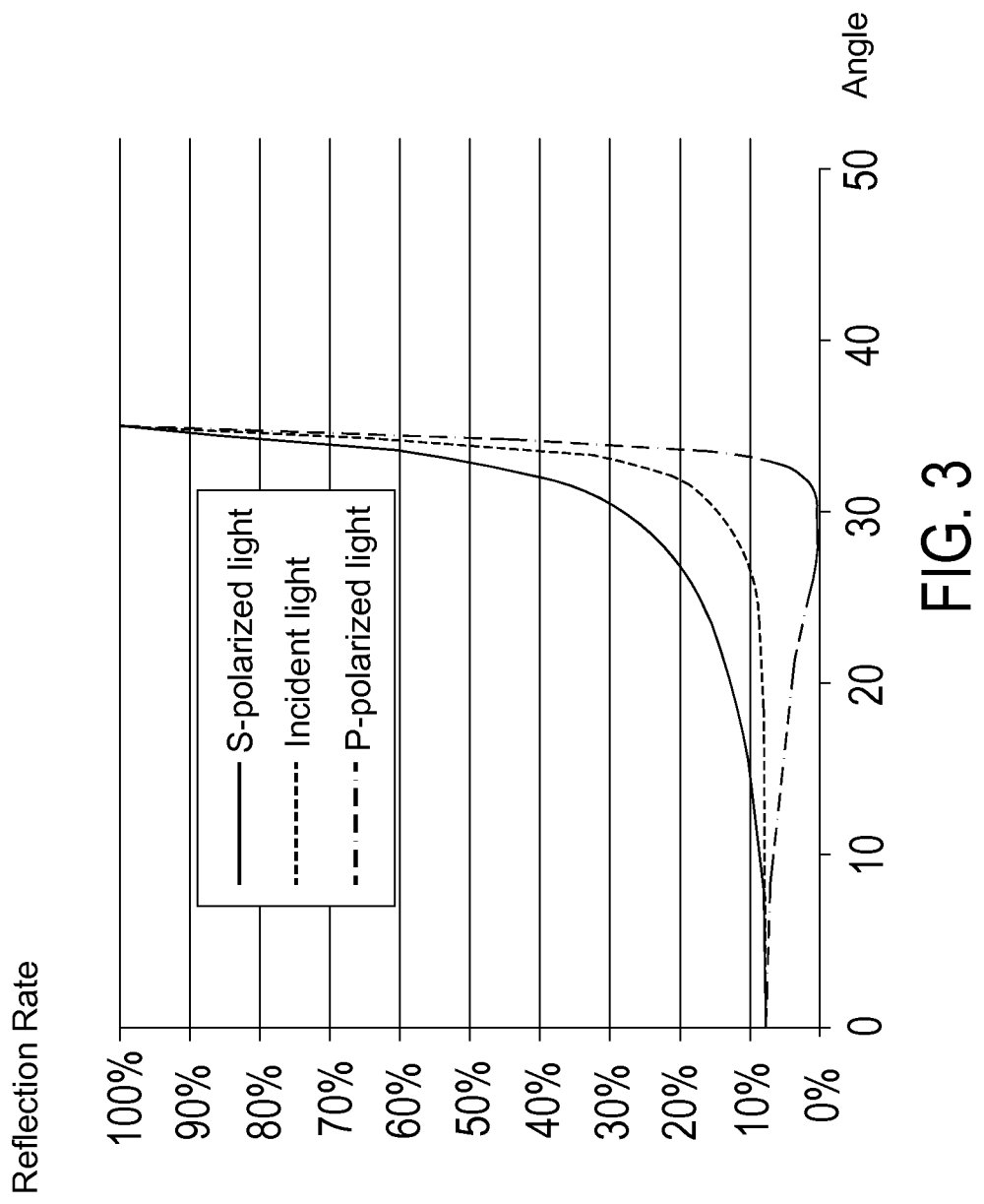
FIG. 3 schematically illustrates the reflection rate-incidence angle diagram of an incident light transmitted from a wavelength-converting device to the air according to an embodiment of the present invention.

Please refer to FIG. 3. FIG. 3 schematically illustrates the reflection rate-incidence angle diagram of an incident light transmitted from a Sapphire substrate to the air according to an embodiment of the present invention. In order to solve the issue of the loss of the incident light of a wavelength-converting device of prior art, the present invention considers the refraction coefficients of the wavelength-converting device and the air and the Brewster angle $\theta_B$ greater than the critical angle $\theta_C$. In a wavelength-converting device, the degree of the Brewster angle is determined by the effective refraction coefficient $n_r$ of the optical layer of the total wavelength-converting device. The degree of the critical angle is determined by the refraction coefficient $n_s$ of the substrate and the refraction coefficient $n_{amb}$ of the environment. If a substrate having a larger refraction coefficient $n_s$, such as a sapphire substrate ($n_s \sim 1.77$), the degree of the critical angle is decreased to 34.4 degrees (as shown in FIG. 3). After a reverse calculation, the maximum of the effective refraction coefficient $n_r$ of the optical layer of the total wavelength-converting device is obtained.

Take the Brewster angle greater than 35 degrees for example. After a reverse calculation, the effective refraction coefficient $n_r$ of the optical layer of the total wavelength-converting device is less than 1.45, but not limited thereto. From the definition of $\theta_B = \tan^{-1}(n_2/n_1)$, it can be found out that the refraction coefficient $n_1$ has to be decreased to get greater Brewster angle $\theta_B$. That is the reason why the present invention provides the configuration of the wavelength-converting device 2 as FIG. 2 to get the Brewster angle $\theta_B$ greater than the critical angle $\theta_C$. Contrastingly, in the conventional wavelength-converting device, the refraction coefficient $n_1$ is limited by the colloidal properties of the phosphor layer, which is generally the silicone material with refraction coefficient $n = 1.4$-$1.5$. The material of the phosphor layer is usually difficult to be adjusted to reach the expected results.

Figure 4A:
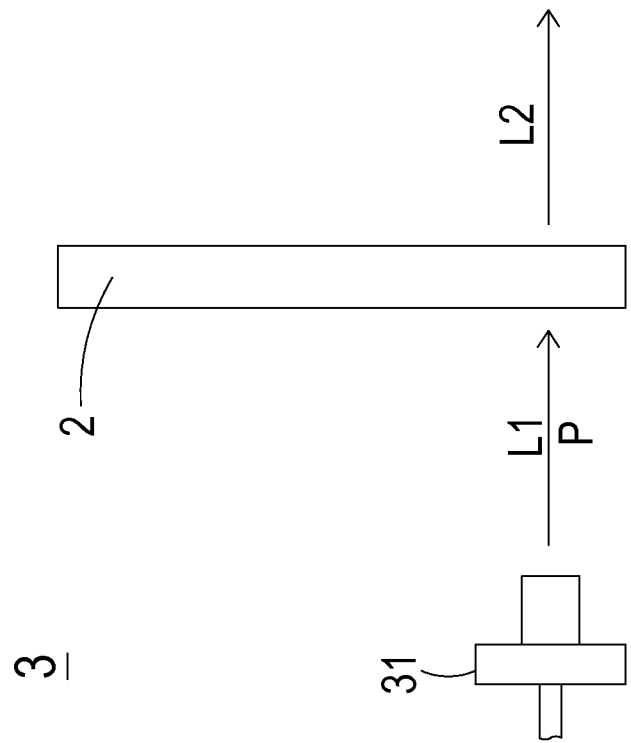
FIG. 4A schematically illustrates the configuration of an illumination system according to an embodiment of the present invention.
Figure 4B:
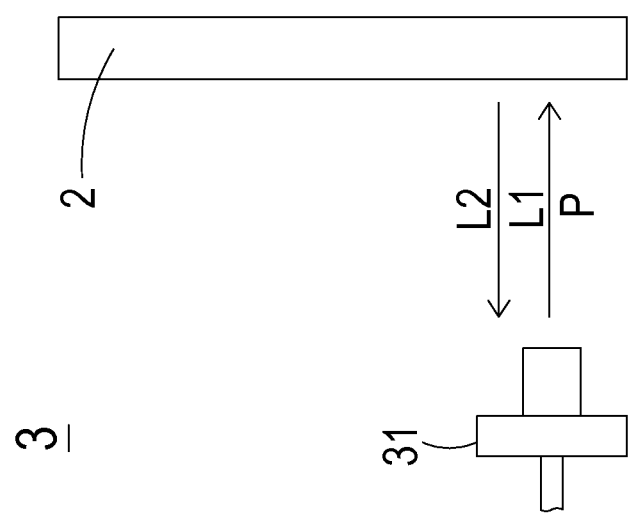
FIG. 4B schematically illustrates the configuration of an illumination system according to another embodiment of the present invention.

Please refer to FIG. 2, FIG. 4A and FIG. 4B. FIG. 4A schematically illustrates the configuration of an illumination system according to an embodiment of the present invention. FIG. 4B schematically illustrates the configuration of an illumination system according to another embodiment of the present invention. As shown in FIG. 2, FIG. 4A and FIG. 4B, the wavelength-converting device 2 of the present invention is used for converting first waveband light L1 emitted by a solid-state light-emitting element 31 of an illumination system 3. The wavelength-converting device 2 includes a transmissive substrate 20, an optical layer 21 and a phosphor layer 22. The transmissive substrate 20, which is not limited to a sapphire substrate, a glass substrate, a borosilicate glass substrate, a borofloat glass substrate, a fused quartz substrate or a calcium fluoride substrate, has a refraction coefficient $n_s$, among which the refraction coefficient $n_s$ is greater than an environmental refraction coefficient $n_{amb}$. The phosphor layer 22 is disposed over a side of the transmissive substrate 20 for converting the first waveband light L1 into second waveband light L2. The optical layer 21 includes at least a metallic material, and the metallic material is not limited to silver, aluminum or an alloy comprising at least one of silver or aluminum (i.e. silver alloy, aluminum alloy or silver-aluminum alloy). Moreover, the optical layer 21 may be multi-layer coating comprising of a distributed Bragg reflector (DBR) or an omnidirectional reflector (ODR), among which the amount of layer of the distributed Bragg reflector and the omnidirectional reflector can be chosen and adjusted to meet the practical demands, such as being coordinated with a reflective wavelength-converting device or a transmissive wavelength-converting device. The number of layer of the distributed Bragg reflector and the omnidirectional reflector is preferably a plurality, but not limited herein. The optical layer 21 is disposed over the other side of the transmissive substrate 20 opposite to the phosphor layer 22 for reflecting the second waveband light L2. The optical layer 21 has an effective refraction coefficient $n_r$. In order to reduce the loss of energy and implement that the Brewster angle $\theta_B$ is greater than the critical angle $\theta_C$, the relation between $n_s$, $n_{amb}$ and $n_r$ satisfies the equation $n_r > 2(n_{amb}^2)/n_s$. As a result, the light leakage is avoided, the fabrication is simplified, and the difficulty of material selection is reduced.

Figure 5:
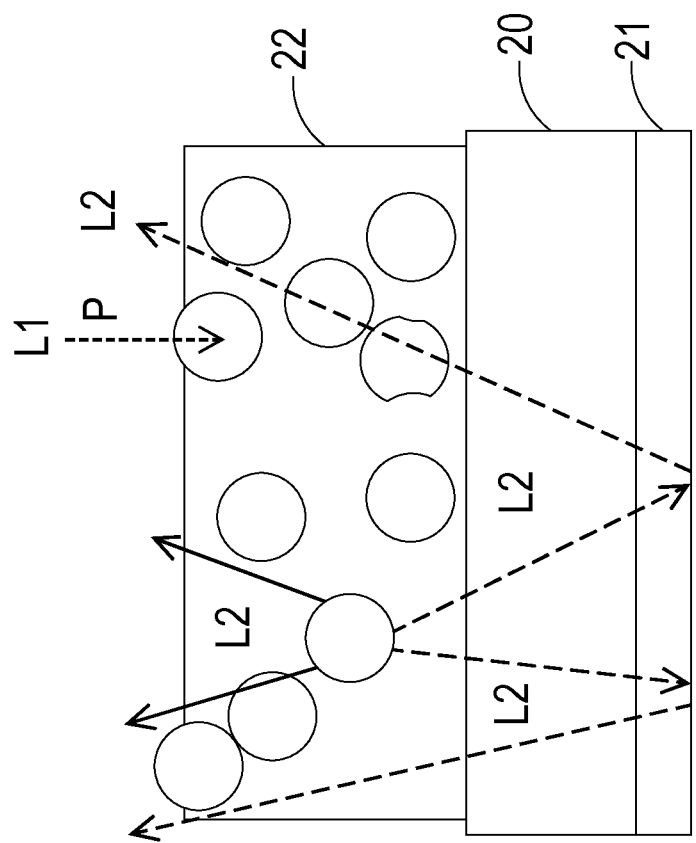
FIG. 5 schematically illustrates a cross-sectional view of a reflective wavelength-converting device according to an embodiment of the present invention.

Please refer to FIG. 2, FIG. 4A and FIG. 5. FIG. 5 schematically illustrates a cross-sectional view of a reflective wavelength-converting device according to an embodiment of the present invention. As shown in FIG. 2, FIG. 4A and FIG. 5, a wavelength-converting device 2 of the illumination system 3 of the present invention can be a reflective wavelength-converting device, among which the solid-state light-emitting element 31 is disposed more adjacent to the phosphor layer 22 than the optical layer 21, so that the incident direction of the first waveband light L1 is substantially opposite to the final output direction of the second waveband light L2. In some embodiments, the transmissive substrate 20 is configured for transmitting the first waveband light L1 and the second waveband light L2, and the optical layer 21 is configured for reflecting the first waveband light L1 and the second waveband light L2. In other words, visible light with wavelength from 400 to 700 nanometers is reflected by the optical layer 21.

Figure 6:
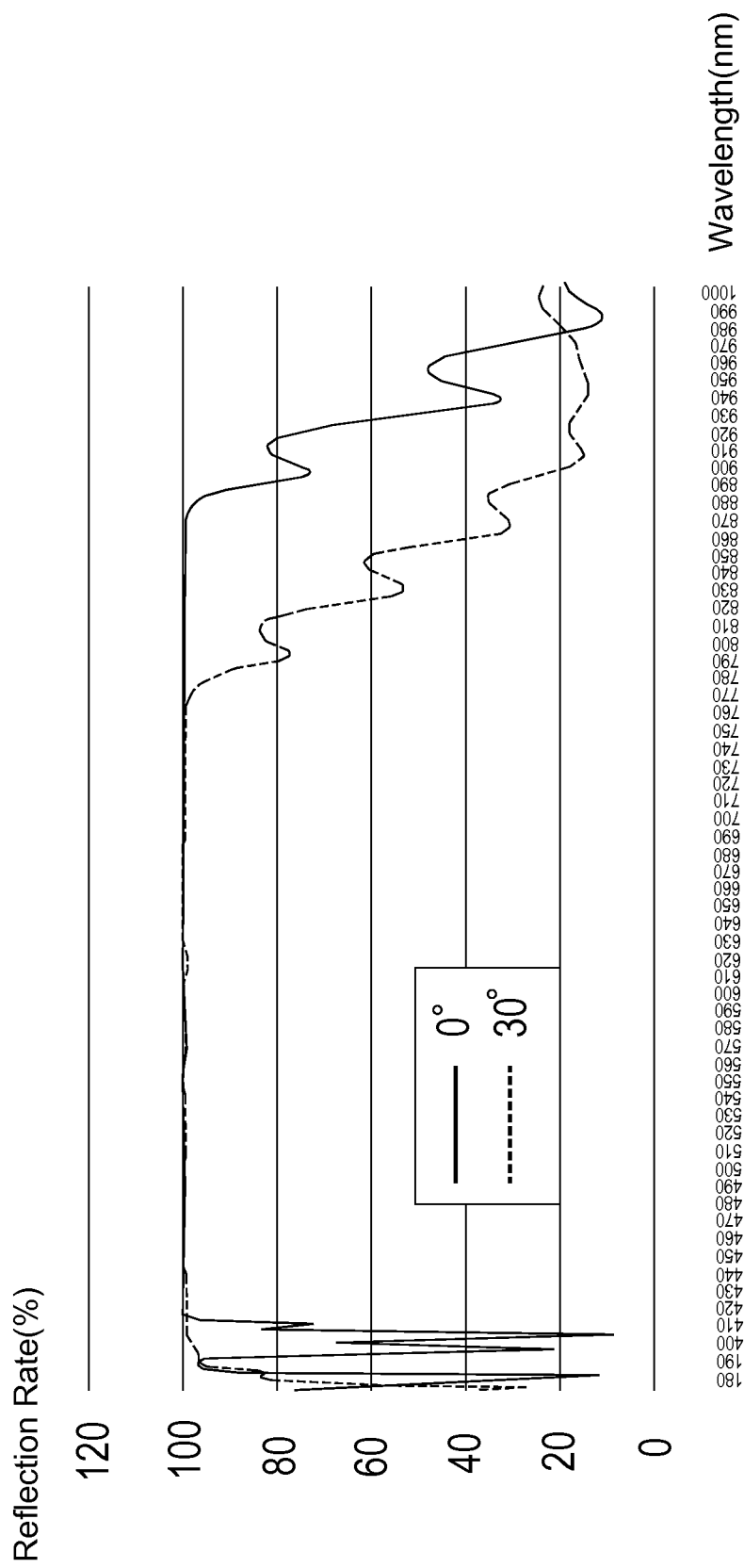
FIG. 6 schematically illustrates the reflection spectrum of the reflective wavelength-converting device shown in FIG. 5.

Please refer to FIG. 5 and FIG. 6. FIG. 6 schematically illustrates the reflection spectrum of the reflective wavelength-converting device shown in FIG. 5. When a sapphire substrate is selected as the transmissive substrate 20 of the reflective wavelength-converting device of the present invention, the critical angle $\theta_C$ is only 34.4 degrees. The optical layer 21 is simple to be designed to get the Brewster angle $\theta_B$ greater than the critical angle $\theta_C$. The reflection spectrum of the reflective wavelength-converting device 2 illustrates that the reflection rates of the visible lights with wavelengths from 400 to 700 nanometers are all about 100%. Additionally, by the total reflection of the critical angle, the incident lights with incidence angles greater than 34.4 degrees are reached all-spectrum and all-angle reflection. As a simplified illustration, the visible lights with wavelengths from 400 to 700 nanometers and incidence angles greater than 30 degrees are not shown in FIG. 6.

Figure 7:
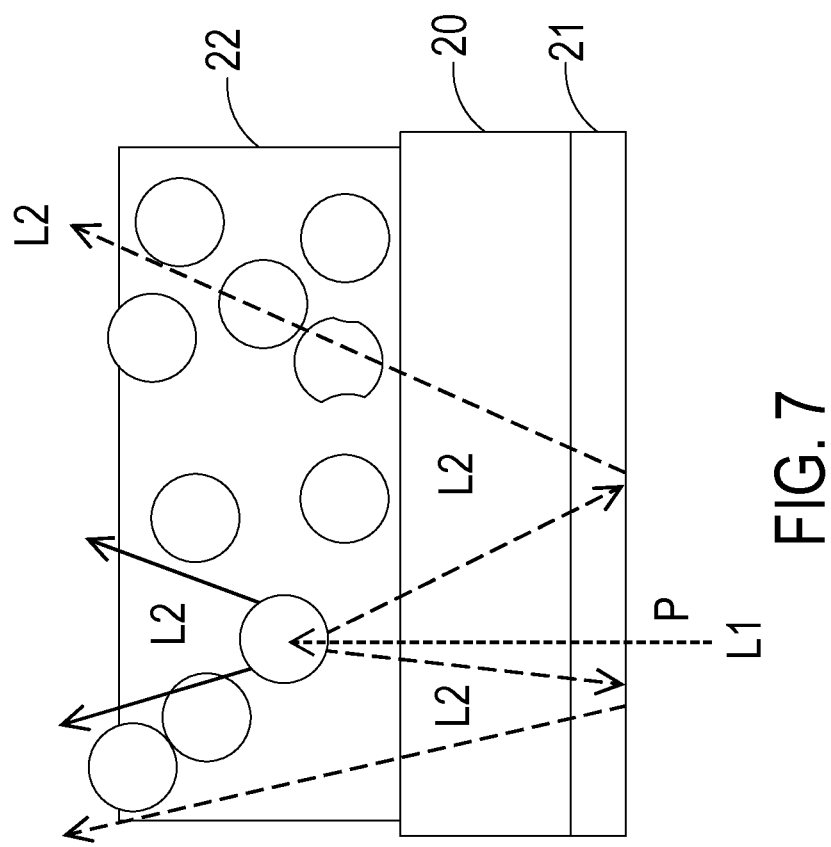
FIG. 7 schematically illustrates a cross-sectional view of a transmissive wavelength-converting device according to an embodiment of the present invention.

Please refer to FIG. 2, FIG. 4B and FIG. 7. FIG. 7 schematically illustrates a cross-sectional view of a transmissive wavelength-converting device according to an embodiment of the present invention. A wavelength-converting device 2 of the illumination system 3 of the present invention can be a transmissive wavelength-converting device, and the solid-state light-emitting element 31 is disposed more adjacent to the optical layer 21 than the phosphor layer 22, so that the incident direction of the first waveband light L1 is substantially similar with the final output direction of the second waveband light L2. In some embodiments, the transmissive substrate 20 is configured for transmitting the first waveband light L1 and the second waveband light L2, and the optical layer 21 is configured for transmitting the first waveband light L1 and reflecting the second waveband light L2, among which the first waveband light L1 is blue light or ultraviolet light, and the second waveband light L2 is visible light with wavelength greater than 460 nanometers, but not limited herein.

Figure 8:
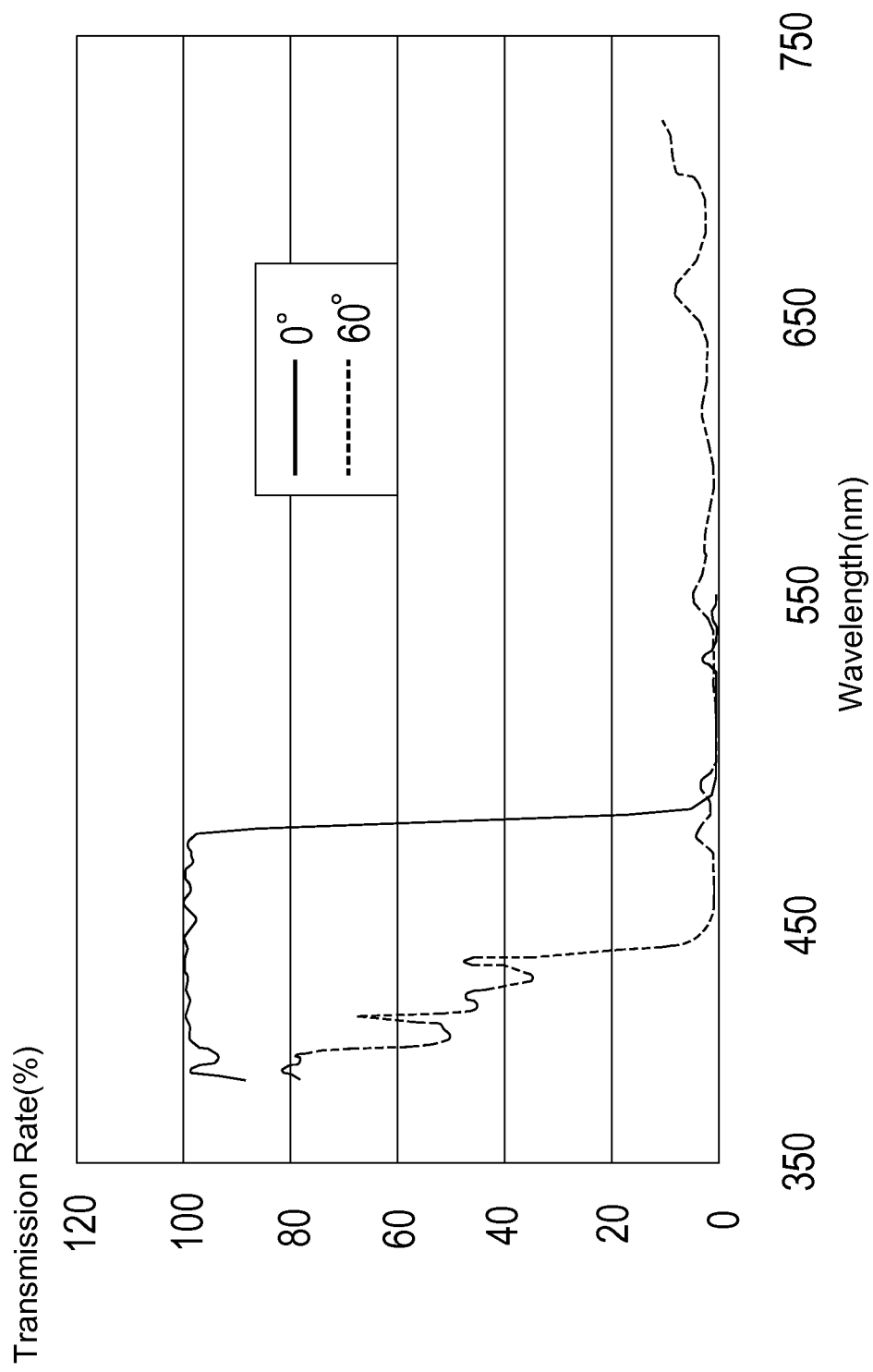
FIG. 8 schematically illustrates the transmission spectrum of the transmissive wavelength-converting device shown in FIG. 7.

Please refer to FIG. 7 and FIG. 8. FIG. 8 schematically illustrates the transmission spectrum of the transmissive wavelength-converting device shown in FIG. 7. When a sapphire substrate is selected as the transmissive substrate 20 of the reflective wavelength-converting device of the present invention to get the Brewster angle $\theta_B$ greater than the critical angle $\theta_C$, the transmission spectrum of the transmissive wavelength-converting device 2 illustrates that the transmission rates of the visible lights with wavelengths greater than 460 nanometers are substantially 0%, which means that the total reflection is almost reached. Additionally, in this embodiment, FIG. 8 also illustrates that the transmission rate of the first waveband light L1, which is blue light with wavelength less than or equal to 460 nanometers, is substantially 100% when the incidence angle is 0 degree, which means that the total transmission is almost reached. It is verified that the optical layer 21 is configured for transmitting the first waveband light L1 and reflecting the second waveband light L2.

From the above description, the present invention provides a wavelength-converting device and an illumination system using the same. By selecting materials and structures for satisfying the equations of $\theta_C = \sin^{-1}(n_{amb}/n_s)$ and $n_r > 2(n_{amb})/n_s$, it is implemented that the Brewster angle $\theta_B$ is greater than the critical angle $\theta_C$. Under this circumstance, the design with a large incidence angle can be reduced by utilizing the total reflection of the critical angle. The light leakage is avoided, the fabrication of the wavelength-converting device and the illumination system is simplified, and the difficulty of material selection is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A wavelength-converting device used for converting first waveband light, comprising:
   a transmissive substrate having opposite first and second sides, and a refraction coefficient $n_s$ greater than an environmental refraction coefficient $n_{amb}$;
   a phosphor layer disposed over the first side of the transmissive substrate for converting the first waveband light into second waveband light; and an optical layer disposed over the second side of the transmissive substrate for reflecting the second waveband light, wherein the optical layer has an effective refraction coefficient $n_r$, such that $n_r > 2(n_{amb}^2)/n_s$.

2. The wavelength-converting device according to claim 1, wherein the optical layer is configured for reflecting both the first waveband light and the second waveband light.

3. The wavelength-converting device according to claim 1, wherein the transmissive substrate is selected from the group consisting of sapphire substrate, a glass substrate, a borosilicate glass substrate, a borofloat glass substrate, a fused quartz substrate and a calcium fluoride substrate.

4. The wavelength-converting device according to claim 1, wherein the optical layer comprises at least metallic material having silver or aluminum.

5. The wavelength-converting device according to claim 1, wherein the optical layer comprises a silver alloy or an aluminum alloy.

6. The wavelength-converting device according to claim 1, wherein the optical layer comprises a distributed Bragg reflector or an omnidirectional reflector.

7. The wavelength-converting device according to claim 1, wherein the optical layer is configured for transmitting the first waveband light and reflecting the second waveband light.

8. The wavelength-converting device according to claim 7, wherein the first waveband light is blue light or ultraviolet light, and the second waveband light comprises visible light with wavelength greater than 460 nanometers.

9. An illumination system, comprising:
a solid-state light-emitting element configured for emitting first waveband light in an optical path; and
a wavelength-converting device disposed on the optical path, comprising:
  a transmissive substrate having opposite first and second sides, and a refraction coefficient $n_s$ greater than an environmental refraction coefficient $n_{amb}$;
  a phosphor layer disposed over the first side of the transmissive substrate for converting the first waveband light into second waveband light and outputting the second waveband light; and
  an optical layer disposed over the second side of the transmissive substrate for reflecting the second waveband light, wherein the optical layer has an effective refraction coefficient $n_r$, such that $n_r > 2(n_{amb}^2)/n_s$.

10. The illumination system according to claim 9, wherein the wavelength-converting device is a reflective wavelength-converting device, and the solid-state light-emitting element is disposed closer to the phosphor layer than to the optical layer.

11. The illumination system according to claim 9, wherein the wavelength-converting device is a transmissive wavelength-converting device, and the solid-state light-emitting element is disposed closer to the optical layer than to the phosphor layer.

* * * * *